United States Patent [19]

Moisan et al.

[11] Patent Number: 4,668,532
[45] Date of Patent: May 26, 1987

[54] SYSTEM FOR SELECTIVE METALLIZATION OF ELECTRONIC INTERCONNECTION BOARDS

[75] Inventors: Michael P. Moisan, Huntington; Joseph P. Cook, Dix Hills, both of N.Y.

[73] Assignee: Kollmorgen Technologies Corporation, Dallas, Tex.

[21] Appl. No.: 646,978

[22] Filed: Sep. 4, 1984

[51] Int. Cl.$^4$ .............................................. B05D 5/12
[52] U.S. Cl. ....................................... 427/97; 427/98; 427/304; 427/305; 427/306
[58] Field of Search ................... 427/98, 97, 304, 305, 427/306, 96, 282

[56] References Cited

U.S. PATENT DOCUMENTS

| | | | |
|---|---|---|---|
| 3,443,988 | 5/1969 | McCormack et al. | 427/98 |
| 3,562,038 | 2/1971 | Shipley et al. | 427/98 |
| 3,799,816 | 3/1974 | Schneble et al. | 427/98 |
| 4,151,313 | 4/1979 | Wajima et al. | 427/98 |
| 4,181,750 | 1/1980 | Beckenbaugh et al. | 427/98 |
| 4,293,592 | 10/1981 | Morishita et al. | 427/98 |
| 4,388,351 | 6/1983 | Sawyer | 427/304 |

Primary Examiner—Sadie L. Childs
Attorney, Agent, or Firm—Morgan & Finnegan

[57] ABSTRACT

An improved process for selective metallization of insulating substrates, as for example in the manufacture of wire scribed interconnection boards, is provided. The substrates optionally include one or more holes or cavities for electrical connections. The process comprises applying an insulating, hydrophobic mask onto the surface of a suitable insulating substrate so as to leave exposed selected areas to be metallized, contacting the substrate with an activator solution for a sufficient time to deposit a catalytic species onto the exposed areas of the substrate and the mask and on the walls of the holes or cavities and thereby render them catalytic to the reception of metal, accelerating the catalytic species and preferentially removing essentially all of the catalytic species from the hydrophobic mask by contacting the substrate with a chelating agent in an alkaline solution having a pH between about 10 and about 14 for a time period sufficient to remove essentially all of said catalytic species from the mask, and then contacting the substrate with a metal deposition solution to metallize only the exposed catalytic areas of the substrate not protected by the hydrophobic mask.

21 Claims, No Drawings

SYSTEM FOR SELECTIVE METALLIZATION OF ELECTRONIC INTERCONNECTION BOARDS

BACKGROUND OF THE INVENTION

1. Field of the Invention

This invention relates to forming a metal pattern on the surface of a substrate and to the products resulting therefrom. More particularly, this invention relates to processes for forming metal patterns on insulating substrates suitable for the manufacture of printed circuit boards by metal plating, e.g., by electroless metal plating, and for forming metallic interconnecting holes or cavities suitable for the manufacture of wire scribed boards.

2. Description of the Prior Art

It is well known to apply an electroless metal plating to an insulating substrate such as plastic, by depositing a noble metal, activator or catalyst suitable for rendering the substrate receptive for electroless metal plating, and then exposing the substrate to an electroless metal plating solution. Various techniques have been used to form a circuit pattern on a desired circuit-forming area, including through-holes, on an insulating substrate by electroless metal plating. Among the processes utilized for forming printed circuit boards in the prior art is a fully additive process. A fully additive process is a process for obtaining conductive patterns by selective deposition of conductive material on unclad base material wherein the entire thickness of electrically isolated conductors is built up by electroless metal deposition.

A fully additive plating process has been employed in the production of wire scribed circuit boards with through-holes including wire assemblies such as those disclosed in U.S. Pat. Nos. 3,646,572; 3,674,914 and 4,097,864, all to Burr, the dislosures of which are hereby incorporated by reference.

Such wire scribed circuit boards are manufactured under the tradename Multiwire ® and may include, for example, networks of fine insulated wires affixed to a surface of a substrate comprising a precatalyzed, epoxy glass laminate. Interconnection between these wires and other conductors are established by drilling perpendicular to the wire planes a hole of such a diameter and location that it intersects the wire, metallizing the barrel of the hole and the intersected tip of the wire, and soldering components or other connectors to the metallized hole.

The laminate substrate and the wiring adhesive layer both contain a catalyst for electroless deposition. A plating mask is applied before forming the holes (or cavities) to be metallized. The substrate then is immersed in an electroless metal bath to deposit metal on the exposed areas. Finally, the mask is stripped, and the substrate is subjected to post-treating operations. Because the catalytic material comprises only part of the laminate substrate and adhesive layer, e.g., part of a reinforced epoxy-glass substrate, its inherent catalytic effect is weak. Also, the electrolessly deposited metal coating tends to slowly cover glass fibers and at times may contain voids where bundles of glass fibers exist at the hole wall surface in the substrate. Voids are openings in a metal layer on a surface of a substrate or on the walls of a hole extending into or through the substrate, the openings being formed due to lack of metallization on the surface or on the hole walls.

An additional difficult plating problem is plating "blind vias" which are cavities having a diameter in the range of 160–600 microns extending from the surface and only partly through the substrate. Differentials in plating thicknesses in a blind via may occur which result in inadequate metal plating at the bottom of the blind via. Methods for producing blind vias in wire scribed boards are described in U.S. application Ser. No. 254,132, filed Apr. 14, 1981 to Lassen, the disclosure of which is incorporated herein by reference.

The production of a high-quality product has been difficult and required careful quality control primarily due to the fact that the precatalyzed laminate has low catalytic activity. To compensate for low catalytic activity on hole walls in the laminate, high activity plating baths have been used Plating baths with high activity are difficult to control. Moreover, a very active bath has a tendency to be unstable. If the bath is too active, extraneous metal deposits, i.e., copper dust particles, precipitate in the solution and drop to the bottom of the bath tank. The copper dust particles also will deposit on the product. These dust particles are incorporated into the metal deposit interrupting the grain structure of the deposit and forming nucleation sites for cracks. Cracks are breaks or fissures in a metal layer on a surface of a substrate or on the walls of a hole extending into or through the substrate as observable with 100X magnification. The breaks or fissures may be formed during metallization of the surface, or of the hole walls, or during soldering or other operations.

A high activity plating bath requires close supervision by the operator. Usually, such a bath is used for one plating cycle and then must be discarded, and disposed of as waste.

If the bath has not been sufficiently active, the copper layer deposited on the hole walls may contain voids and cracks.

Voids in the copper layer forming the "wrap-around area" are an additional quality control problem of additively plated wire scribed boards where the wire is severed when the hole is formed. A "wrap-around area" forms when insulation surrounding the wire (e.g., a polyimide jacket) is etched back during a hole cleaning operation. The insulation is etched back typically from about 0.005 mm to about 0.5 mm from the intersection of the wire with the hole wall. Then, this "wrap-around area" must be completely filled with a copper deposit which wraps around the wire where the wire intersects the hole wall. It is essential that a void-free and crack-free layer of copper be deposited in this region to produce a reliable product.

In one process for making a wire scribed board, an alkaline permanganate treatment has been used not only to remove resin smear(s) produced by a hole drilling step, but also to etch back the polyimide wire insulation to some extent. Following the permanganate treatment, the hole is "neutralized" and rinsed. Neutralizers such as SnCl12, formaldehyde or hydrazine-hydrate solutions have been used. However, despite the neutralization step, the permanganate treatment has been found to reduce catalytic activity of the precatalyzed base material. As a result, it has been necessary to operate the electroless copper plating bath in two different modes.

In an initial mode, because the catalytic activity is so low, the copper plating bath activity must be sufficiently high to form an initial copper film layer. After formation of such initial layer, the bath formulation is changed to a less active and more stable condition to complete the copper deposition. However, the time to form the initial copper layer is long. It takes 20 minutes to about 3 hours to electrolessly deposit an initial copper film onto a pattern on the substrate and within the though-holes. Switching between the two modes is sometimes difficult to control. As a result, the copper plating bath cannot be used on a continuous basis.

Additive plating processes also have been employed for producing printed circuits on non-catalytic substrates. In one process, a mask pattern is laid down on the surface of an insulating substrate. The entire surface, including both the mask and the exposed substrate areas, is treated and coated with a sensitizer and an activator, and then the entire surface is treated with a metal deposition solution. Metal deposits both on the exposed substrate areas and on the mask-covered areas. The mask and the metal coating electrolessly deposited on the mask are later removed by means of a solvent to leave only the desired metal conductor pattern. In this process, because of the relatively heavy formation of metal over the mask area, the edges of the conductors have a tendency to be ragged and hence resolution is not as good as required for precision uses.

Another electroless deposition process involves first sensitizing and activating the entire surface of an insulating substrate before applying a mask pattern. After the mask pattern is applied, the entire surface is treated with an electroless metal deposition solution. In this method, metal deposits predominantly on the sensitized and activated exposed substrate areas and not to any significant degree on the mask-covered areas. Resolution is good in this method, but the method has serious disadvantages, e.g., (1) in that sensitization and activation of the entire surface of the substrate produces a surface which may have a relatively low resistivity between conductors deposited thereon, and if spacing is to be very close, as is required in many of today's applications, this may cause electrical breakdown, and (2) manufacturing handling problems, in that during the long processing sequence between activating and finally electrolessly plating, the catalytic surface is highly sensitive to contamination, scratching, and the like which can result in defective circuits.

Another additive plating process for a non-catalytic substrate is described in U.S. Pat. No. 4,388,351 to Sawyer. According to such process, a printed circuit board is formed by applying a removeable negative mask pattern onto the surface of a non-catalytic substrate whereby portions of the surface are exposed in a positive pattern, forming micropores in the positive pattern portions of the substrate surface, sensitizing the positive pattern portion of the substrate and the negative mask to form thereon a catalytic species capable of catalyzing electroless metal deposition, optionally electrolessly depositing a thin porous flash metal deposit having a thickness of from 0.075 to 0.5 microns onto the delineated catalytic species in the circuit pattern, removing the negative mask and thereby the catalytic species and the flash electroless metal deposited thereon, and electrolessly depositing a metal onto the catalyzed positive pattern.

However, the process described in U.S. Pat. No. 4,388,351 has the deficiency of poor control of the edge definition of the conductor due to the mask stripping operation. The conductor edges are not adhesion promoted. When a thick copper buildup, e.g., about 35 microns, is required, copper adherently deposits on the center core of the conductor which has been adhesion promoted, which may have a width as small as 125 microns and grows out and up about the same, i.e., about 35 microns on each side of the conductor. Thus, 70 microns of a conductor width of 195 microns would not be bonded, rendering this process suitable only for coarse conductor patterns.

Still another additive plating process for a non-catalytic substrate is described in U.S. Pat. No. 3,799,816 to Schneble et al. According to this process, plated through-hole printed circuit boards containing thereon a printed circuit pattern are prepared by: forming holes in an insulating substrate at preselected points, applying a hydrophobic insulating mask on the circuit pattern, leaving the holes exposed, the mask being essentially activator-repellent, contacting the substrate with an activator solution comprising stannous ions and precious metal ions in solution to render the hole walls, but not the exposed surface of the hydrophobic mask, sensitive to the reception of electroless metal, contacting the substrate with an electroless metal deposition solution to deposit electroless metal on the exposed areas of the substrate including the hole walls, but not on the exposed surface of the hydrophobic mask, and treating the substrate with an etching solution a number of times to remove minor deposits of metal on the mask while leaving the electroless metal deposit on the exposed areas substantially unimpared, the etching solution being capable of dissolving the electroless metal (See column 3, lines 35-54 of U.S. Pat. No. 3,799,816).

U.S. Pat. No. 3,443,988 proposes a process for preventing deposition of electroless metal on masks by applying materials capable of neutralizing surface imperfections present on masking resins. However, since printed circuits require a long plating time, deposition of metal on masks is not prevented by such process.

U.S. Pat. Nos. 4,293,592 and 4,151,313 describe processes of preventing deposition of electroless metal on masks by utilizing hydrophobic masks containing pigments or additives to inhibit metal deposition in combination with organic acid washing solutions to wash the activation from the mask.

The masks comprise silk screen printed, epoxy resin based resists. Incorporated in the resists are inhibitors which inhibit the deposition of the noble metal catalyst on the mask so that smaller quantities of noble metal are deposited on the mask than on the circuit pattern. According to U.S. Pat. No. 4,151,313, the masking material must contain a solid solution of oxides of titanium, nickel and antimony. In addition, the noble metal which does deposit on the mask must be removed with a solution of hydrochloric acid and ammonium persulfate. According to U.S. Pat. No. 4,293,592, the masking material must contain 2-20 parts by weight of inhibitors such as sulfur, selenium, arsenic, zinc, antimony aluminum, iron, manganese, chromium, lead phosphorus, cadmium, vanadium, or oxides, chlorides, salts thereof. The noble metal which does deposit on the mask is removed with an aqueous solution of an organic acid and hydrochloric acid and/or nitric acid. The insulating substrate then is dipped in an electroless metal plating solution to form an electroless metal plating on a positive pattern of circuit. These processes teach away from applicant's invention because even though they disclose the use of inter alia, an alkaline accelerator solution, there is no suggestion of keeping the accelerator solution in contact with the substrate for a sufficient amount of time to remove essentially all catalyst species from the surface of the masks and by doing this avoid all other complicated steps.

Accelerator solutions have been used in electroless plating processes for many years. Their basic function is to complete the reaction between stannous chloride and palladium chloride from the activator and dissolve the resulting stannic tin. This results in active noble metal (palladium metal) sites on the circuit board substrate. At one time, some accelerator solutions comprised alkaline solutions containing complexing agents to dissolve the tin. However, acidic accelerators containing acids such as hydrogen fluoride, dilute fluoroboric acid, ammonium bifluoric acid, perfluoric acid and oxalic acid, have been preferred. These acidic accelerator solutions leave the activator in place, including the activator contamination on the mask.

SUMMARY OF THE INVENTION

1. Objects of the Invention

It is an object of this invention is to provide an improved process for electrolessly plating a wire scribed circuit board having through-holes and/or blind vias wherein a metal layer, e.g., copper, which is void-free and free of fissures or breaks is deposited on the hole walls and in the wrap-around area.

An object of the invention is to provide a "steady state" electroless copper plating system for plating wire scribed circuit boards which is less dependent on operator intervention during the plating cycle.

Another object of the invention is to provide a process for selective electroless deposition on a printed wiring board in which activator deposited on a hydrophobic mask and the surface of the board is selectively removed from the mask by treatment with an alkaline accelerator solution.

It is an object of the present invention to provide an improved process for copper plating a circuit board having plated through-holes and/or blind vias.

Other objects and advantages will be set forth in part herein and in part will be obvious herefrom or may be learned by practice with the invention, the same being realized and attained by means of the instrumentalities and combinations pointed out in the appended claims.

2. Brief Description of the Invention

This invention is based upon the discovery that an alkaline solution containing a chelating agent may be used not only as an accelerator for noble metal catalytic species deposited on surfaces of an insulating substrate including the hole walls but also as a means to selectively remove essentially all of the catalytic species deposited on a hydrophobic mask on the substrate. Accelerators speed up electroless deposition by removing tin from a palladium-tin activator which has been deposited on the substrate surface. It is surprising and unexpected that the same solution which "accelerates" and thereby enhances the activity of the palladium activator also removes the palladium activator.

It has been found that use of certain alkaline solutions as accelerators for a predetermined time period: (1) is sufficient to remove essentially all of the catalytic species sites deposited on an insulating mask, preferably below a surface concentration of 0.002 mg/cm$^2$, and (2) does not sufficiently reduce the concentration of catalytic species sites on a substrate surface and on walls of holes and/or blind vias to result in the formation of voids during subsequent metal plating. The alkaline solutions contain chelating agents and have a pH between about 10 and about 14. Moreover, this time period can be shortened by agitation. The time in the alkaline accelerator solution required to remove essentially all of the catalytic species sites deposited on the mask is proportional to the degree of solution movement.

With vigorous stirring, 5 to 20 minutes immersion in the alkaline accelerator solution is effective for removal of the catalytic sites from the mask, but the formation of an initial electroless metal deposit is slowed down as discussed below. For example, an initial electroless copper deposit was found to appear in five minutes if an epoxy glass panel received ten minutes of immersion in the vigorously stirred alkaline accelerator solution; and in ten minutes if the panel received a twenty minutes immersion in the vigorously stirred accelerator solution. However, in an alkaline accelerator solution which was still, i.e., not stirred, thirty minutes immersion of the panel is preferred to remove the catalyst from the surface of the mask; and coated insulating substrates can be immersed for up to two hours in a still alkaline accelerator solution with only a slight increase in the time required for formation of the initial electroless metal layer.

Movement of the alkaline accelerator solution may be accomplished by well known solution movement techniques. In one such technique, solution movement is accomplished through the use of compressed air which is distributed throughout the accelerator solution by spargers with holes of a specific diameter. The holes in the spargers generally are uniformly spaced apart from one another in order to ensure uniform distribution of air which then bubbles throughout the accelerator solution.

Another such technique involves recirculation of the accelerator solution by means of a pumping system. The pumping system removes a specific volume of accelerator solution from a first location in the accelerator tank in a specified period of time, e.g., 4 liters/min. and then returns it to a second location in the plating tank which is spaced apart from the first location. The accelerator solution returns to the tank through an opening in the tank or through a sparger system similar to that described above and the accelerator solution is uniformly distributed throughout the tank.

Still another and the most common technique for solution movement involves the use of mechanical mixing devices. The particular mixing device which is used depends upon the tank volume and configuration. This allows one skilled in the art to select power rating which when used in conjunction with a mixing propeller of a given diameter, with a specific pitch on its blades and operating within a preselected range of revolutions per minute, provides the desired solution movement.

A cleaner/conditioner solution may be advantageously used according to this invention to degrease the substrate surface including walls of the holes and render such surfaces receptive to the deposition of catalytic species. Use of a cleaner/conditioner solution prior to use of the noble metal activator aids in the deposition of the catalyst for electroless metal plating on the hole walls and on the surface of the substrate.

A cleaner/conditioner solution improves adherence of catalytic species, such as palladium ions, to surfaces of insulating substrates such as epoxy, phenolic and epoxy glass substrates. The conditioning function of the cleaner/conditioner solution forms a bond to the glass fibers or plastic at the surface of the substrate, which then acts as a bridge between the palladium ions and the substrate.

Briefly, this invention provides, in one aspect, an improvement in a process for depositing metal on a wire scribed circuit board having at least one insulated wire affixed to a surface of a substrate or imbedded therein and having at least a portion of the surfaces of the substrate covered with a hydrophobic mask and having at least one hole and/or blind via in the substrate and intersecting the wire wherein the walls of the hole and/or blind via and the intersected wire are metallized by metal deposition, the improvement which comprises:

contacting the surfaces of the substrate including said walls with a catalyst solution comprising an agent suitable for rendering exposed surfaces receptive to metal deposition, contacting the entire surface including said walls and said hydrophobic mask with an accelerator solution comprised of a chelating agent in an alkaline solution for a time period sufficient to selectively remove substantially all of the noble metal from the hydrophobic mask while accelerating the noble metal activator on said walls, the accelerator solution having a pH between about 10 and about 14; and depositing a metal layer on the catalyzed surface of said walls.

In another aspect, this invention provides an improved process for producing a printed circuit on surfaces of an insulating substrate by electroless metal plating which substrate optionally includes one or more holes for electrical connections, said process including the steps of:

applying a hydrophobic and insulating mask onto a surface of the substrate whereby portions of the surface are unmasked and exposed, the surface of the mask material being resistant to the deposition of a catalytic species capable of catalyzing an electroless metal deposition;

contacting with a catalyst comprising an agent capable of promoting metal deposition the mask and any unmasked portion of the substrate surface;

contacting the entire surface of the substrate and mask with an accelerator solution;

removing the catalytic species from the surface of the mask; and contacting the substrate surface with an electroless metal plating solution to form an electroless metal plating on the unmasked portion of the substrate surface and on walls of the holes;

the improvement which comprises:

using as the accelerator solution a chelating agent in an alkaline solution having a pH between about 10 and about 14, and contacting the substrate surface with such alkaline accelerator for a time period sufficient to remove essentially all the catalytic species from the surface of the mask and leave catalytic species on the unmasked portion of the substrate surface and on the walls of the holes.

3. Detailed Description Of The Invention

Although the invention will be described principally in terms of the production of plated though-hole wire scribed boards, printed circuit boards and other metallized products advantageously may be produced by following the teachings herein.

Circuit boards produced according to this invention use certain insulating and hydrophobic masks which repel and substantially are not wetted by activating and/or sensitizing solutions commercially used in the production of printed wiring boards. As a result, when such masks contact such solutions, they are rendered receptive to electroless metal deposition to a lesser degree than unmasked boards. Use of these resinous masks in this invention leads to considerable savings in production costs of the boards described herein, as well as other advantages.

The term "activator" is used in the sense recognized by those skilled in the art of electroless plating to contemplate means to render a non-conductive material receptive to the electroless deposition of a metal. Synonyms are "seeder", "catalyst" or "sensitizer". Most frequently, palladium-containing solutions are used commercially as activators.

The term "hydrophobic" as used herein, generically refers to any resinous or plastic material which is not wetted by the solutions employed in the art to render insulating substrates catalytic to the reception of electroless metal, regardless of shape or thickness, and includes thin films and strips as well as thick substrata.

Wire scribed circuit boards may be prepared by the procedure described in U.S. Pat Nos. 3,646,572; 3,674,914 and 4,097,864, all to Burr, the disclosures of which are incorporated herein by reference. In such procedure, ground and power busses are produced by etching a copper bus pattern on a copper clad plastic laminate, typically a precatalyzed epoxy glass laminate containing catalytic filler of the type described in U.S. Pat No. 3,600,330 to Leech et al. A layer of glass cloth impregnated with a B-staged epoxy resin containing the catalytic filler described above is coated on both sides with a catalytic adhesive and laminated over the etched busses. Insulated wire circuit patterns are scribed on the adhesive surface. Typically, the wire is 0.06 to 0.16 mm diameter copper wire insulated with a 0.01mm thick polyimide jacket.

After the wiring step, another layer of glass cloth impregnated with epoxy resin and typically containing the catalytic filler is laminated over the wire scribed circuit pattern. The wire scribed circuit board then is coated with a hydrophobic mask, typically a polyethylene film. Holes are drilled through the mask into the panel cutting through the scribed wire and/or the busses at points where electrical connections are required.

Resin smear formed on the wire at the intersection of the wire with the hole wall is removed by an oxidizing solution, and the insulation on the wire is etched back. Then, the hole walls are treated sequentially with a cleaner-conditioner solution, an activator solution and an accelerator solution.

The hydrophobic mask substantially prevents the surface from being rendered as sensitive to electroless metal deposition as the unmasked hole walls. Activator thus is deposited on the hole walls at more than twice, and preferably more than five times, the concentration that it is deposited on the mask due to differences in wettability of their respective surfaces by the activator solution. The surface of the substrate and the hole walls then are treated with an alkaline accelerator of this invention which not only accelerates the activator deposited on the hole walls, but also removes the activator deposited on the mask. After a rinsing step, the substrate is contacted with an electroless metal deposition solution to metallize the walls of the holes. The metal deposit can be built up to the required thickness by electroless deposition alone, or when the conductor pattern is suitable, the initial electroless plating can be followed by electroplating.

In another embodiment of the present invention, a printed circuit pattern is formed on an insulating substrate using a hydrophobic mask which is not wetted by an activator solution. The mask essentially resists wetting by the activator solutions, and also is resistant to attack by acids and alkali to which printed circuit boards will ordinarily be subjected in processing. The mask preferably has a smooth, glossy surface. Holes are optionally provided in the substrate by any method such as by drilling, piercing or punching methods. The substrate may be treated to adhesion promote the unmasked portions of the substrate and/or remove any resin smears from hole walls. Treatment with an oxidizing solution is the preferred method to adhesion promote the unmasked portions and/or remove any resin smears. Then, the surface of the substrate and the holes walls are treated with a cleaner-conditioner solution to condition the adhesion promoted surface including the hole walls to receive the activating solution. After the substrate is rinsed, it is contacted with the activator solution (e.g., a palladium-tin activator) to catalyze the conductor pattern and the walls of the holes to the reception of electroless metal. As discussed above, the hydrophobic mask substantially prevents the masked portion of the surface from being rendered as sensitive to electroless metal deposition as the unmasked portion of the surface and the hole walls. The subsequent treatment with an alkaline accelerator of this invention not only accelerates the activator deposited on the unmasked portions of the substrate and the holes, but also removes the activator deposited on the mask. The required conductors then are formed by electroless deposition of metal.

The mask may be registered or non-registered. If registered, as described hereinabove, the holes may be formed either before or after mask application. If non-registered, the mask will usually be applied before hole formation. In the non-registered solder mask embodiment, the substrate having a circuit pattern thereon is coated with a mask, following which holes and/or blind vias extending through the mask and into the substrate are formed. In this embodiment, the catalyzation and electroless metal deposition steps already described are then carried out.

Suitable organic resins for the insulating substrates described herein include thermosetting resins, thermoplastic resins and mixtures of the foregoing.

Suitable thermoplastic resins include the acetal resins; acrylics, such as methyl acrylate; cellulosic resins, such as cellulose acetate, cellulose propionate, cellulose acetate butyrate, cellulose nitrate and the like; nylon; polyethylene; styrene blends, such as acrylonitrile styrene co-polymers and acrylonitrile-butadiene-styrene copolymers; and vinyl polymers and copolymers, such as vinyl acetate, vinyl chloride, vinyl chloride-acetate copolymer, and vinylidene chloride; polyetheretherketone; polyetherimide; polysulfones and polyethersulfones.

Suitable thermosetting resins include allyl phthalate; furane; melamine-formaldehyde; phenol formaldehyde and phenol-furfural copolymer, alone or compounded with butadiene acrylonitrile copolymer or acrylonitrile-butadiene-styrene copolymers, including such copolymers by themselves; polyacrylic esters; urea formaldehydes; epoxy resins; allyl resins; glyceryl phthalates; polyesters; and the like.

Since the activating solutions used to render insulating substrates catalytic to the reception of electroless metal are generally aqueous in nature, the mask is selected to form a hydrophobic, i.e., water repellant surface. Suitable hydrophobic resins for forming such masks included silicone resins such as those disclosed in U.S. Pat. No. 2,937,976; polyethylene resins such as those disclosed in U.S. Pat. No. 3,224,094; fluorocarbon resins (e.g., polytetrafluoroethylene) such as those described in U.S. Pat. No. 3,203,829; polyurethane resins; acrylic resins; and mixtures of the foregoing. The hydrophobic resins may be used by themselves, but preferably they are used in combination with other resinous materials, for example, any of the resins described above for use as the insulating substrate, in an amount sufficient to provide the composition with hydrophobic characteristics. Particularly useful hydrophobic masks may be produced by combining epoxy novolak resins to obtain a smooth, glossy surface after curing.

The processes of this invention contemplate the use of a substrate having a surface comprising an adherent resinous layer, the layer having uniformly dispersed therein finely divided particles consisting of oxidizable and degradable synthetic or natural rubber. Such substrates are disclosed in Stahl et al. U.S. Pat. No. 3,625,758, which disclosure is incorporated herein by reference.

Those skilled in the art of electroless metal deposition will understand that the process of this invention can be used to catalyze selected portions, i.e., unmasked portions, of a non-catalytic substrate for electroless metal deposition. Also, the processes of this invention can be used to enhance the catalytic activity of precatalyzed substrates by adding additional catalytic species to the unmasked portion of the substrate. Thus, the preparation of wire scribed interconnection boards on precatalyzed base material, as described above, may be duplicated on base material which is not precatalyzed. Also, the preparation of printed circuit boards may be carried out on precatalyzed laminates. The use of precatalyzed laminates and with the activator solutions and alkaline accelerator of this invention is preferred.

There are many well-known means to render the surface catalytic. Among them are sequential processes such as by immersing the substrate in a cleaner/conditioner solution and in a solution of stannous ions followed by immersing the so-treated substrate in an acidic solution of precious metal, e.g., palladium or platinum ions. Unitary baths also may be employed for such purposes, such as the dispersions of colloidal palladium and tin ions described in Shipley U.S. Pat. No. 3,011,920, or preferably the soluble complexes of noble metals, stannous ion and anions as described in Zeblisky U.S Pat. No. 3,672,938.

Cleaner/conditioner solutions are well known in the art and are used to remove light oils, fingerprints, and other surface contaminants and to condition holes for activation and electroless copper plating. Typical cleaner/conditioner solutions include those described in U.S. Pat. No. 3,563,784 to W.P. Innes et al., U.S. Pat. No. 3,684,572 to K. Taylor as well as those commercially available as Metex PTH Cleaner 9076 TM from MacDermid Inc., Waterbury, Conn.; Cleaner/Conditioner 1175A TM from Shipley Co. Inc., Newton, Mass.; a Sir-Cuit 4318BS TM Cleaner/Conditioner from Luster-On Products, Inc., Springfield, Mass.; and GC-120 TM Cleaner/Conditioner from PCK Technology Div., Kollmorgen Corp., Melville, NY.

Many cleaner/conditioners are formulated to contain small quantities of solvents such as diethylene glycol monobutyl ether. Cleaner/conditioners without solvents in the formulation are preferred in metallizing wire scribed circuit boards. Among such cleaner/conditioners are Sir-Cuit 4318BS and GC-120.

A suitable alkaline accelerator solution includes one or more chelating agents in an alkaline solution. The pH of the solution should be between about 10 and 14. At a pH below about 10, the ability of the chelating agent to complex metal ions in solution may be diminished. An alkaline solution containing the chelating agent(s) and having a pH between about 10 and about 14 may be prepared by well known techniques such as adding the chelating agent and sufficient sodium or potassium hydroxide to an aqueous solution to produce the desired pH. Suitable chelating agents may be selected from among an amino acid, an alkanolamine and a polyfunctional carboxylate.

Suitable amino acids include glycine and nitrilotriacetic acid.

Suitable alkanolamines include hydroxyethylenediamine triacetic acid (HEDTA), a salt of HEDTA and ethylene diamine tetrapropanol.

Suitable polyfunctional carboxylates include citrates and tartrates.

The chelating agent is present in the alkaline solution in an amount greater than about 0.01% by weight preferably greater than about 0.1% by weight, and more preferably greater than about 0.4% by weight, of the alkaline solution. The chelating agent also is present in the alkaline solution in an amount less than about 10% by weight, preferably less than about 5% by weight, and most preferably less than about 2% by weight of the alkaline solution.

Subsequent to treatment with an alkaline accelerator solution according to this invention, the resinous substrate may be metallized by electroless deposition, for example, by depositing a nickel layer from a conventional nickel hypophosphite bath as known in the art. Instead of electroless nickel, electroless copper can be applied from a conventional copper deposition bath which contains, in addition to a reducing agent for cupric ions, a complexing agent, and other conventional ingredients. A suitable electroless copper bath may be prepared by admixing the following: $CuSO_4 5H_2O$, 10 g/l; ethylenediaminetetraisopropanol, 17 ml/l; formaldehyde (37% solution), 15 ml/l; NaCN, 30 mg/l; a block co-polymer wetting agent, consisting of 50% polyoxyethylene combined with 50% polyoxypropylene and having a molecular weight in the range of 4500 (Pluronic P-85 commercially available from BASF-Wyandotte Co.), 1 mg/l; water and NaOH (to volume and pH 12.8). Other suitable electroless metal baths are described in U.S. Pat. Nos. 3,433,829; 3,485,643; 3,607,317 and 3,625,758, incorporated herein by reference, and gold, silver, cobalt and other electroless baths are known to those skilled in the art.

The following examples illustrate processes according to the invention.

EXAMPLE 1

Wire scribed panels were prepared by the procedures of Burr, U.S. Pat. Nos. 3,646,572, 3,674,914 and 4,097,864. A layer of glass cloth impregnated with B-staged epoxy containing catalytic filler of the type described in U.S. Pat. No. 3,600,330 to Leech et al. was coated on both sides with catalytic adhesive 0.1 mm thick. This was laminated to a sheet of catalytic epoxy glass laminate 1.6 mm thick. Wire circuit patterns were scribed on the adhesive surface using 0.16 mm diameter copper wire coated with 0.01 mm thick polyimide insulation. After the wiring step, a layer of glass cloth impregnated with an epoxy resin containing the catalytic filler was laminated by heat and pressure over the wire scribed circuit pattern. The panels then were coated on both surfaces with a polyethylene film bonded by a pressure sensitive adhesive. Holes, 1.17 mm in diameter, were drilled through the panels intersecting and cutting through the scribed wire at points where electrical connnections were to be made. Next, the resin smear, formed on the wire where the wire end forms part of the hole wall, was removed by: immersion for 1 hour at 60° C. in a permanganate oxidizing solution containing 60 g/l of $KMnO_4$ and 0.2 g/l of fluorinated alkyl carboxylate at a pH of 12.5, using a standard rack agitator operating at 35 cycles per minute, each cycle consisting of a two inch reciprocating stroke.

After the resin smear removal, neutralization of the permanganate was accomplished by 3 minute immersion in an aqueous solution of stannous chloride, 30 g/l and hydrochloric acid, 330 ml/l followed by immersion in a 3 g/l solution of stannous chloride and hydrochloric acid 330 ml/l for another 3 minutes. After rinsing with water to remove the neutralizing solutions, the board then was immersed for 20 minutes at 60° C., using the same rack agitation conditions described above, in a hot alkaline solution comprising 150 g/l of NaOH and 1 g/l of paranonylphenoxy-polyglycidol surfactant (sold under the tradename Olin 10G by Olin Corp.), followed by vigorous rinsing with water.

The thus treated board was immersed in 40 g/l of an alkaline cleaner-conditioner (sold under the tradename SIR-CUIT 4318BS ™ by Luster-On Products, Inc., 54 Waltham Ave., Springfield, Mass. 01109) for 5 minutes at 60° C. and agitated as described above. After rinsing with water, the board was immersed in a sodium persulfate solution (60 g/l ±5 g/l) at a pH of 2.0 to 2.5 at 40° C. for between 2½ and 3 minutes under the same rack agitation conditions described above, rinsed with water again, followed by immersion in a 100 ml/l solution of sulfuric acid, and rinsing again in water for about 3 minutes.

The board was immersed for 2 minutes in a predip solution containing 5 g/l of stannous chloride and 200 g/l of sodium chloride and having a pH of up to 0.5 under the rack agitation conditions previously described. This procedure was followed by activating in a solution of Pd—0.15 g/l, Sn—11 g/l; Cl—145g/l; pH of less than 0.5 prepared by adding 32 ml/l of the solution prepared according to Example 1 of U.S. Pat. No. 3,961,109 to 970 ml of a 200 g/l sodium chloride brine for 5 minutes at a temperature between 22° C. and 25° C. under the same rack agitation conditions previously described.

After rinsing in water, the board was immersed in an alkaline accelerator solution containing 3.0 g/l of NaOH, 11.25 ml/l of a 41% solution of hydroxyethylenediaminetriacetate (HEDTA) (sold under the tradename Chel DM-41 by Ciba-Geigy Corporation), and an organic phosphate wetting agent, nonyl phenoxy polyglycidyl phosphate (sold under the tradename Gafac RE-610 by GAF Corp.), for five minutes with vigorous stirring of the accelerator solution and under the same rack agitation conditions described above. The acceleration solution was vigorously stirred in a 160 liter tank using a 2-speed mixer with a 3-inch 3-bladed propeller having a 1.5 pitch ratio and operating between 1200 and 1600 revolutions per minute (Super Pitch ® propeller commercially available from Mixing Equipment, Inc., Rochester, NY 14603). The resulting board was rinsed in water and electrolessly plated as described below.

The board was immersed in an electroless bath containing 8 g/l of $CuSO_4 \cdot 5 H_2O$, 3.5–4.0 ml/l of HCHO, 35 g/l of $Na_4$ EDTA and 0.14 ml/l of nonyl phenoxy polyglycidyl phosphate (Gafac RE-610) and 0.05 millimoles/liter of cyanide (as measured by Orion Cyanide Ion Specific Electrode). The bath temperature was 70°–72° C. the pH was between 12.0 and 12.1 (measured at 25° C.). During electroless deposition, the board was constantly agitated using a rack agitator operating at 30 cycles per minute, each cycle consisting of a two inch reciprocating stroke.

After about 20 hours, the board was removed from the copper bath and rinsed with water. The wired circuit board obtained has a uniform and smooth copper deposit on the walls of the holes. The copper is free of voids and nodules. Essentially no detectable copper dust particles or flecks were deposited on the polyethylene mask.

The polyethylene mask was stripped and the board subjected to conventional post plating operations such as mechanical treatments, baking, cutting to size and drilling mounting holes, to produce a wired circuit board according to the present invention.

EXAMPLE 2

Example 1 was repeated six times except as follows:
1. Following the smear removal and neutralization treatments, immerse each board in an aqueous cleaner/conditioner for 6 minutes at 60° C. using a rack agitator operating at 35 cycles per minute, each cycle consisting of a two inch reciprocating stroke. This cleaner/conditioner contains triethanolamine —5 g/l, a quaternary ammonium surfactant 3 g/l and a nonylphenoxypolyglycidol surfactant —4 g/l, at a pH of 10.8.
2. Rinse each board in ambient running water for 5 minutes.
3. Immerse each board for 1 minute at ambient temperature in a mild copper etching solution comprising: sodium persulfate —60 g/l; sulfuric acid to pH —2.5 and using the rack agitation conditions described in step 1 above.
4. Rinse each board in running water for 5 minutes.
5. Immerse each board for 1 minute in a deoxidizing solution comprising: water —900 ml/l; sulfuric acid —100 ml/l and using the rack agitation conditions described in step 1 above.
6. Rinse each board in running water for 5 minutes.

One board, designated as A, was processed directly in the electroless copper solution of Example 1. The other five boards, designated as B, C, D, E and F, were treated according to the following procedures:

7. Immerse each board for 3 minutes at ambient temperature in an acidic solution of 5 g/l tin chloride dissolved in a 200 g/l sodium chloride brine;
8. Immerse each board for 10 minutes at 40° C. in the palladium-tin-chloride activator solution of Example 1 and using the rack agitation conditions described in step 1 above; and
9. Rinse each board in running water for 5 minutes.

Board B was treated with a conventional aqueous acidic accelerator solution as follows: immerse for 2 minutes in dilute aqueous fluoroboric acid solution with mild stirring and using the rack agitation conditions described in step 1 above. The accelerator solution was mildly stirred using the 2-speed mixer described above in example 1 operating between 600 and 1000 revolutions per minute. Board B then was rinsed in running water for 5 minutes and immersed in the electroless copper bath.

The C, D, E and F boards were treated with the alkaline accelerator solution of Example 1. This accelerator solution was vigorously stirred using the 2-speed mixer described above in example 1 operating between 1200 and 1600 revolutions per minute. The panels were agitated using the rack agitation conditions described in step 1 above. Board C was immersed in this alkaline accelerator for one and a half minutes. Board D was immersed for three minutes. Board E was immersed for 5 minutes. Board F was immersed for 10 minutes. After the alkaline accelerator treatment, boards C, D, E and F all were rinsed in running water for 5 minutes and then placed in the electroless copper bath disclosed in Example 1.

After 5 minutes in the electroless copper bath all the boards were examined. Board A had no copper plating. Board B had a copper film through the holes but approximately 30% to 40% of the polyethylene mask also was coated with electroless copper. Boards C, D and E each had a film of copper plating the holes. Board F had apparently no copper plating. Board C, which had been immersed for one and a half minutes in the alkaline accelerator, had some copper plated on the polyethylene mask. Board D, which had been immersed in the alkaline accelerator for 3 minutes, had slight plating on the mask. Board E, which had been immersed in the alkaline accelerator for 5 minutes, had a clear mask surface. The boards were removed from the plating bath after 5 hours, and examined again. In board A, the copper was growing on the epoxy in the hole but had not yet knitted over the glass fiber bundles, and over the adhesive layer that is, there were still a large number of voids in the copper deposit. In board F, although there were still some voids over fiber bundles, the copper had already completely covered the epoxy portions of the hole wall and the adhesive layer. The B, C, D and E boards all had approximately 8 microns of copper uniformly throughout the holes. Board B also had 8 microns of copper on the surface of the polyethylene mask while boards C and D panels had a slight copper deposit on the polyethylene mask. Board E had no deposit at all on the polyethylene mask.

These results are summarized in the Table below:

| Boards | Electroless Plating Catalyst | Accelerator Solution | Through Hole Plating | Extraneous Plating On Mask |
|---|---|---|---|---|
| A | Catalytic laminate | — | Poor | Satisfactory: No copper |
| B | Catalytic laminate and activator solution | 1 min- acidic mild stirring | Good | 40% copper coverage |
| C | Catalytic laminate and activator solution | 1.5 min- alkaline vigorous stirring | Good | 21% copper coverage |
| D | Catalytic laminate and activator solution | 3 min- alkaline vigorous stirring | Good | Fair: trace of copper |
| E | Catalytic laminate and activator | 5 min- alkaline vigorous | Good | Satisfactory no copper |

| Boards | Electroless Plating Catalyst | Accelerator Solution | Through Hole Plating | Extraneous Plating On Mask |
|---|---|---|---|---|
| F | solution Catalytic laminate and activator solution | stirring 10 min alkaline vigorous stirring | Fair | Satisfactory no copper |

Thus, it can be seen that copper deposition was faster on the activate boards. Also, the activated boards had a better plated through-hole and, combined with the use of the alkaline chelating solutions as an accelerator, reduced the optimum immersion time and prevented the deposition of copper on the mask.

EXAMPLE 3

The procedures of Example 2 were repeated except that the smear removal as accomplished by treating at 60° C. for 60 minutes with the following solution: $KMnO_4$ —15 g/l, pH of 12,6, fluorinated alkyl carboxylate —0.2 g/l and then neutralizing, rinsing and treating with 50% NaOH at 95° C. for 20 minutes. Essentially the same results were obtained except the copper build-up over the fiber bundles in boards B, C, D and E for this example was thicker than for the corresponding boards B, C and D in Example 2.

EXAMPLE 4

The procedure of Example 2E was repeated for boards designated A, B, C and D except that the accelerator solution was still, i.e., not stirred, and the immersion time in the accelerator was 15, 30, 60 and 90 minutes, respectively. After 60 minutes in the electroless copper bath, boards A, B, C and D were examined. Board A had continuous copper plating through the holes but approximately 50% electroless copper coverage of the polyethylene mask. Board B also had continuous copper plating through the hole with no electroless copper plating on the polyethylene mask. In board C, there were small voids in the copper plating on the hole walls and there was no copper on the mask. In board D, there was virtually no copper plating through the holes and none of the polyethylene mask.

EXAMPLE 5

Example 5 describes an additive printed circuit board manufactured by the procedures of this invention. Two catalytic, glass cloth reinforced, flame retardant epoxy substrates, each 1.5 mm thick, were prepared by the procedures of Example X of U.S. Pat. No. 3,600,330, Schneble et al., incorporated herein by reference. The catalytic substrates were coated on both surfaces with the catalytic adhesive described in Example IX of U.S. Pat. No. 3,779,758, Polichette incorporated herein by reference. This adhesive had a film thickness of 25 microns. The adhesive coated substrates were drilled with the hole pattern for a plated, through-hole, printed wiring board. An epoxy resist image or mask outlining the desired conductor pattern was printed on both surfaces of each of the adhesive coated substrates. The substrates were adhesion promoted in chromic acid solution. After adhesion promotion, the chromic acid was neutralized and rinsed from the surfaces of each substrate. One of the adhesive coated substrates thus treated was placed directly in the electroless copper bath described below, as a control. The other adhesive coated substrate was treated with the alkaline cleaner/conditioner, rinse, pre-dip, activator, rinse and five minutes immersion in the alkaline accelerator and rinsed, all steps as in Example 2. Both substrates were immersed in electroless copper plating solution of the following formulation:

| | |
|---|---|
| Copper Sulfate | 0.025 moles/liter |
| Formaldehyde | 0.4 moles/liter |
| Ethylenediaminetetracidic acid | 0.07 moles/liter |
| Cyanide Ion Activity | 0.025 millimoles/liter |
| Alkylphenoxypolyglycidyl phosphate | 0.05 millimoles/liter |
| Temperature | 60° C. |

After 15 minutes plating, the control substrate had no copper deposited thereon while the substrate treated with the activator and accelerator had 75% of the hole walls plated and 95% of the surface conductor pattern plated. There was no plating on the mask area. After 90 minutes plating, the control substrate had approximately 5% of the hole walls plated and about 60% of the surface conductors plated while the substrates treated with the activator and the accelerator acccording to this invention had 100% coverage on the hole walls and 100% coverage on the surface conductors. There was no plating on the resist mask. After 24 hours plating of the panel treated with activator and accelerator, the conductor pattern was completely covered with 35 microns of copper and there was no deposit of copper on the resist mask.

EXAMPLE 6A

The following example illustrates the application of this invention to substrates that do not contain catalytic filler.

A wire scribed circuit board was prepared by the procedures of Burr, U.S. Pat. No. 3,674,914. A non-catalytic prepreg (a sheet of glass cloth impregnated with epoxy resin) was coated on both sides with a non-catalytic adhesive. This was laminated to a sheet of non-catalytic epoxy glass laminate 1.6 mm thick. Wire circuit patterns were scribed on the adhesive surface using insulated wire with an overall diameter of 0.186 mm. After the wiring step, a layer of non-catalytic prepreg was laminated by heat and pressure over the wire scribed circuit pattern. The board then was coated on both surfaces with a hydrophobic polyethylene film by means of a pressure sensitive adhesive. Holes, 1.17 mm in diameter, were drilled through the board intersecting and cutting the scribed wiring pattern at points where electrical connections were to be made. The hole walls were chemically cleaned as described in Example 1 above and, after rinsing, were prepared for electroless copper plating by the following procedure:

1. Immerse the board in an alkaline cleaner/conditioner solution (SIR-CUIT 4318BS ™ a product of Luster-On Products, Inc. 54 Waltham Ave., Springield, MA 01109) for 5 minutes at 55° C. with rack agitation as described in step 1 of Example 2.

2. Rinse the board for 3 minutes in running water.

3. Immerse the board in 60 g/l sodium persulfate solution.

4. Rinse the board for 3 minutes in running water.

5. Immerse the board in a solution containing 100 ml/l sulfuric acid.

6. Rinse the board for 3 minutes in running water.

7. Immerse the board in an acidic predip solution of 5 g/l tin chloride dissolved in a 200 g/l sodium chloride brine.

8. Immerse the board for 5 minutes in an activator solution containing 150 mg palladium per liter, at 40° C. prepared by dissolving 32 ml of the concentrate solution of Example 1, Kremer et al. U.S. Pat. No. 3,961,109 in a liter of acidic predip solution.

9. Rinse the board for 3 minutes in running water.

10. Immerse the board for 5 minutes in an alkaline accelerator solution of the following composition: hydroxyethylethylenediaminetriacetate —11.25 ml/l, sodium hydroxide —3 g/l, alkylphenoxypolyglycidylphosphate —0.02 g/l, the balance being water, using the rack agitation conditions described in step 1 of Example 2 and vigorously stirring using the 2-speed mixer described in Example 1 operating between 1200 and 1600 revolutions per minute.

11. Rinse the board for 3 minutes in running water.

12. Immerse the board in the electroless copper plating solution of Example 1.

After three hours in the copper plating solution, the board was examined.

There was a copper layer, 8 microns thick, which was void-free and free of fissures and breaks, plated uniformly on the hole walls. The polyethylene mask on the surface was completely free of copper deposits.

EXAMPLE 6B

Example 6A is repeated except that as the alkaline cleaner/conditioner, the cleaner/conditioner of Example 2 is used.

EXAMPLE 7A

Example 7 illustrates the importance of the alkaline accelerator.

Three wire scribed circuit boards designated as A, B and C, were prepared by the procedure of Burr, U.S. Pat. No. 3,674,914. An epoxy-glass prepreg sheet, which had dispersed throughout a catalyst for electroless metal deposition, was coated on both surfaces with an adhesive also containing a catalyst for electroless metal deposition. This was bonded to a sheet of catalytic epoxy-glass laminate 1.6 mm thick. Wire circuit patterns were scribed on the adhesive surface using insulated wire with an overall diameter of 0.186 mm. A layer of catalytic prepreg was laminated by heat and pressure over the wire scribed circuit pattern. Each board then was coated on both surfaces with a polyethylene film by means of a pressure sensitive adhesive. Holes, 1.17 mm in diameter, were drilled through each board where required. These holes exposed some of the catalyst contained in the laminate and in the adhesive. The holes were chemically cleaned as described in Example 1 above and, after rinsing, were prepared for electroless copper plating by the following procedure:

1. Treat each board according to the procedures set for in steps 1–9 of Example 6A.

2. Immerse board A for 5 minutes in the alkaline accelerator solution described in Example 6A, using the rack agitation conditions described in step 1 of Example 2 and vigorously stirring using the 2-speed mixer described in Example 1 operating between 1200 and 1600 revolutions per minute.

3. Rinse board A for 3 minutes in running water.

4. Immerse board A in the electroless copper plating solution of Example 1.

5. Immerse board B for 5 minutes in a conventional acid accelerator solution of 100 ml/l fluoboric acid and 10 ml/l of hydroxyethylenediaminetriacetic acid (HEDTA) and using the rack agitation conditions described in step 1 of Example 2.

6. Repeat steps 3 and 4 above for board B.

7. Immerse board C for 5 minutes in an acid accelerator of 200 g/l sodium chloride and 10 ml/l hydrochloric acid and using the rack agitation conditions described in step 1 of Example 2.

8. Repeat steps 3 and 4 above for board C.

After 5 minutes of electroless copper plating, board A had a uniform film of copper in the holes, but there was no copper deposit on the surface. After 5 minutes of electroless copper plating, boards B and C had a uniform film of copper in the holes. However, 75% of the surface of the polyethylene mask also was covered by a uniform film of copper in boards B and C.

After three hours plating, board A had 8 microns of copper plated in the holes and no copper deposited on the surface of the polyethylene resist.

EXAMPLE 7B

Example 7A is repeated except that as the alkaline cleaner/conditioner, the cleaner/conditioner of Example 2 is used.

EXAMPLE 8A

In order to quantify the removal of palladium from the hydrophobic resist surface, the following test was performed:

Four epoxy-glass substrates were prepared with a polyethylene resist film bonded to both surfaces thereof. No holes were drilled in the substrates. Three substrates were treated following the procedures set forth in steps 1–9 of Example 6A. A first substrate then was treated in the alkaline accelerator solution of Example 6A as described in Example 6A.

A second substrate then was treated with the acid accelerator solution of step 5 of Example 7A and as described therein.

A third substrate received no further treatment. A fourth substrate was designated as a control and received no treatment at all.

The edges of all four substrates were trimmed so that of the total surface exposed to palladium activator, only the polyethylene surfaces remained.

The substrates were each soaked in an aliquot of acqua regia to strip off palladium from the polyethylene resist.

The acqua regia aliquots were analyzed by Atomic Absorption Spectrophotometry with the following results:

| Panel Treatment | Pd on Resist Surface |
|---|---|
| 1. Alkaline Accelerator | .0012 mg/cm$^2$ |
| 2. Acid Accelerator | .0048 mg/cm$^2$ |
| 3. No Accelerator | .0064 mg/cm$^2$ |
| 4. Control | .0010 mg/cm$^2$ |

The palladium analysis of the control (0.0012 mg/cm$^2$) shows the lower limit of the method, i.e., the method cannot detect any difference between 0.001 ug/cm$^2$ and 0 ug/cm$^2$. This illustrates that the alkaline accelerator treatment is effective in reducing the palladium adsorbed on a hydrophobic surface to a level approximating the control which was not treated with palladium. The acid accelerator is not effective in removing palladium from the hydrophobic surface.

EXAMPLE 8B

Example 8A is repeated except that as the alkaline cleaner/conditioner, the cleaner/conditioner of Example 2 is used The invention in its broadest aspects is not limited to the specific steps, methods, compositons and improvements shown and described herein but departures may be made within the scope without departing from the principles of the invention.

EXAMPLE 8C

Example 8A was repeated with two substrates being prepared for each condition. One of the substrates was electrolessly plated with copper using the electroless copper bath of example 5 and another of the substrates was analyzed for palladium on its surface. Also, Example 8A was repeated with two substrates as described above except that the immersion in the alkaline accelerator was for a 2 minute duration. The results are set forth in the Table below.

|  | Selective Seeding | | | Plating on surface |
|---|---|---|---|---|
|  | Area (cm$^2$) | mg/l | mg/cm$^2$ |  |
| Control | 186 | 0.08 | 0 | none |
| No acceleration | 198 | 1.92 | 0.0097 | 75% |
| Fluoroboric acid accelerator | 208 | 1.44 | 0.0069 | 100% |
| 2 minute alkaline accelerator | 206 | 0.30 | 0.0015 | 5% |
| 5 minutes alkaline accelerator | 202 | 0.20 | 0.0010 | none |

As shown in the Table above, after acceleration the amount of palladium left on per cm$^2$ of the resist should be below 0.002 mg/cm$^2$ to avoid subsequent deposition of electroless metal on the resist surface.

What is claimed is:

1. In a process for depositing metal on a wire scribed circuit board having at least one insulated wire affixed to a surface of a substrate or imbedded therein and having at least a portion of the surfaces of the substrate covered with a hydrophobic mask and having at least one hole or at least one blind via in the substrate and intersecting the wire, wherein the walls of the hole or blind via and the intersected wire are metallized by metal deposition, the improvement which comprises:

contacting the surface of the substrate including said walls with an activator solution comprising an agent suitable for rendering exposed surfaces receptive to metal deposition;

contacting the entire surface including said walls and said hydrophobic mask with an accelerator solution comprised of a chelating agent in an alkaline solution for a time period sufficient to selectively remove essentially all of the activator from the hydrophobic mask while accelerating the activator on said walls, the accelerator solution having a pH between about 10 and about 14; and depositing a metal layer on the catalyzed surface of said walls.

2. A process as defined in claim 1 wherein the alkaline acclerator solution is agitated when contacted with the substrate.

3. A process as defined in claim 1 further including the step of contacting the mask and the surfaces of the substrate including said walls with a cleaner/conditioner solution prior to contacting them with the activator.

4. A process as defined in claim 1 wherein said chelating agent is selected from the group consisting of an amino acid, an alkanolamine and a polyfunctional carboxylate.

5. A process as defined in claim 4 wherein said chelating agent comprises an amino acid.

6. A process as defined in claim 5 wherein said amino acid is selected from the group consisting of hydroxy ethylenediamine triacetic acid and salts thereof, glycine, and nitrilotriacetic acid.

7. A process as defined in claim 4 wherein said chelating agent comprises an alkanolamine.

8. A process as defined in claim 7 wherein said alkanolamine is selected from the group consisting of hydroxyethylenediamine tetraacetic acid and salts thereof, and ethylene diamine tetrapropanol.

9. A process as defined in claim 4 wherein said chelating agent comprises a polyfunctional carboxylate.

10. A process as defined in claim 9 wherein said polyfunctional carboxylate comprises a citrate or a tartrate.

11. A process as defined in claim 1 wherein the activator solution comprises a solution of palladium, tin and chloride.

12. A process as defined in claim 1 wherein the activator is removed to leave a concentration thereof on the mask below about 0.002 mg/cm$^2$.

13. A process as defined in claim 1 wherein the alkaline accelerator solution is agitated at a predetermined rate.

14. A process as defined in claim 11 wherein said metal layer is deposited on the activated surface of said walls by electroless metal deposition.

15. An improved process for producing a printed circuit on surfaces of an insulating substrate by electroless metal plating, said process including the steps of:

applying a negative, hydrophobic and insulating mask onto a surface of the substrate whereby portions of the surface are unmasked and exposed, the surface of the mask material being resistant to the deposition of a catalytic species capable of catalyzing an electroless metal deposition;

contacting with a catalyst comprising an agent capable of promoting metal deposition, the mask and any unmasked portion of the substrate surface;

contacting the entire surface of the substrate and mask with an accelerator solution;

removing the catalytic species from the surface of the mask; and contacting the substrate surface with an electroless metal plating solution to form an electroless metal layer on the unmasked portion of the substrate surface;

the improvement which comprises:

using as the accelerator solution a chelating agent in an alkaline solution having a pH between about 10 and about 14, and contacting the substrate surface with such alkaline accelerator for a time period sufficient to remove essentially all the catalytic species from the surface of the mask and leave catalytic species on the unmasked portion of the substrate surface.

16. A process as defined in claim 15 which further includes the steps of:
providing one or more holes in the insulating substrate at preselected points;
leaving the holes exposed during the application of the mask;
adhesion promoting walls of the holes;
activating the walls of the holes to form the catalytic species thereon;
contacting the catalyst species on the hole walls with the accelerator solution; and
contacting the hole walls with the electroless metal plating solution to form the electroless metal layer on the hole walls which, in conjunction with the electroless metal layer on the positive pattern of the substrate surface, forms a plated through-hole printed circuit board.

17. A process as defined in claim 16 wherein the insulating substrate comprises a resinous material, the holes are provided by a drilling step which also smears resin on the walls of the hole, and wherein the walls of the holes are adhesion promoted with an oxidizing solution to remove any resin smears from the hole walls.

18. A process as defined in claim 15 wherein the activating step uses an activator solution comprised of stannous ions and precious metal ions in solution.

19. A process as defined in claim 17 wherein the mask comprises a material selected from the group consisting of epoxy novolak resin, silicone resin, polyethylene resin, fluorocarbon resin, polyurethane resin, acrylic resin and mixtures of the foregoing.

20. A process as defined in claim 15 wherein the electroless metal comprises copper.

21. An improved process for producing a printed circuit on surfaces of an insulating substrate, said process including the steps of:
providing a circuit pattern on a surface of the substrate;
unselectively applying a nonregistered, hydrophobic and insulating mask over the circuit pattern;
subsequently forming a hole through the nonregistered insulating mask and into the insulating substrate;
contacting the surface of the substrate including the wall of said hole with a catalyst solution comprising an agent capable of promoting metal deposition;
contacting the entire surface of the substrate and mask with an accelerator solution;
removing the catalytic species from the surface of the mask; and
contacting the entire surface of the substrate and mask with an electroless metal plating solution to form an electroless metal layer on the hole wall;
the improvement which comprises:
using as the accelerator solution a chelating agent in an alkaline solution having a pH between about 10 and about 14, and contacting the substrate surface with such alkaline accelerator for a time period sufficient to remove essentially all the catalytic species from the surface of the mask and leave catalytic species on the wall of the hole.

* * * * *